(12) United States Patent
Sakuragi

(10) Patent No.: US 6,266,265 B1
(45) Date of Patent: Jul. 24, 2001

(54) MEMORY MODULE USING A VACANT PIN TERMINAL FOR BALANCING PARASITIC CAPACITIVE LOADS

(75) Inventor: Shinji Sakuragi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/572,661

(22) Filed: May 16, 2000

(30) Foreign Application Priority Data

May 17, 1999 (JP) .................................................. 11-136038

(51) Int. Cl.$^7$ ........................................................ G11C 5/06
(52) U.S. Cl. ................................ 365/63; 365/51; 365/52; 365/230.03
(58) Field of Search ................................. 365/63, 51, 52, 365/45, 230.03, 230.01

(56) References Cited

U.S. PATENT DOCUMENTS 5,357,624 * 10/1994 Lavan ..................................... 711/115
5,867,448 * 2/1999 Mann ..................................... 365/233
6,026,007 * 2/2000 Jigour et al. ............................ 365/51
6,049,476 * 4/2000 Laudon et al. .......................... 365/52

* cited by examiner

*Primary Examiner*—Hoai V. Ho
(74) *Attorney, Agent, or Firm*—McGuireWoods LLP

(57) ABSTRACT

A memory module includes a first group of integrated-circuit memory units each having a control pin terminal, and a second group of integrated-circuit memory units. Each memory unit of the second group includes a control pin terminal and at least one memory unit of the second group further includes at least one vacant pin terminal. First connections are provided for receiving a control signal from an external source and supplying it to the control pin terminal of each of the first group of memory units. Second connections are provided for receiving and supplying the control signal to the control pin terminal of each of the second group of memory units and to at least one vacant pin terminal of the second group of memory units. Preferably, the vacant pin terminal is connected to a circuit equivalent in operating characteristics to a circuit connected to the control pin terminal.

15 Claims, 6 Drawing Sheets

MEMORY MODULE USING A VACANT PIN TERMINAL FOR BALANCING PARASITIC CAPACITIVE LOADS

BACKGROUND OF THE INVENTION

1. Field of the Invention

The present invention relates generally to semiconductor memory modules and more specifically to a memory module in which timing differences among memory units are eliminated by balancing their parasitic capacitive loads.

2. Description of the Related Art

As shown in FIG. 1, the current semiconductor memory module is comprised of a plurality of integrated-circuit memory units (packages) divided into two groups according to clock pulse sequences supplied from clock terminals CLK0 and CLK1. For one thing, memory modules do not necessarily have an even-number of memory units, the clock groups have different numbers of memory units. In FIG. 1, nine memory units U0 to U8 are shown divided into a first group of chips U0 to U4 and a second group of chips U5 to U8, the first group being driven by clock pulses from terminal CLK0 and the second group by clock pulses from terminal CLK1. Further, design considerations may dictate that memory units are divided into a plurality of clock groups so that each group may have a different number of memory units from other groups.

Because of the high clock frequency, the lines connecting the clock terminals CLK0 and CLK1 to the clock inputs of the respective memory units can be considered as transmission lines involving parasitic capacitance. To minimize the differences in parasitic capacitance among the memory units, the clock lines are patterned so that they have equal length. However, the clock source of the terminal CLK0 is required to drive one memory unit greater than is required for the clock source of terminal CLK1. This difference in load between the clock sources causes a time delay $\Delta t$ between the point at which the rising edge of the CLK1 pulse passes the threshold and the point at which the rising edge of the CLK0 clock pulse passes the threshold as shown in FIG. 2. Setup time and hold time are defined. The setup time (tS) starts when a signal changes state and lasts until the rising edge of a clock pulse crosses the threshold and the hold time (tH) starts when the clock pulse crosses the threshold and lasts until the signal changes state. The time window "tWindow" (which is equal to the sum of the setup and hold times) of clock source CLK0 is delayed by $\Delta t$ with respect to the time window of clock source CLK1 and hence the total time window tWindow is lengthened by $\Delta t$. This is undesirable from the performance viewpoint since it reduces the operating margin of the module. Furthermore, the clock skew $\Delta t$ causes the access time (tAC) and data hold time (tOH) for output data of each clock group to differ from those of the other clock group.

In order to overcome the clock-skew problem, Intel's PC100 memory module includes a dummy capacitor 10, which is connected to the clock terminal CLK1, as shown in FIG. 3. Since the value of this capacitor is equal to the capacitance which the clock input of each memory unit has, the load capacitance of each clock source is balanced with the load capacitance of the other clock source. However, since the load capacitance of the clock input of each memory unit depends largely on design, production process and operating voltage, it is difficult to precisely determine the value of the dummy capacitor.

Similar problem occurs with memory modules in which data mask signals (DQMB) are used to drive its memory units. As shown in FIG. 4, memory units U3 and U4 are driven by a common data mask signal DQMB3, while the other memory units are individually driven by respective data mask signals. Parasitic capacitive load imbalance exists between the combined capacitance of memory units U3 and U4 and the individual capacitance of each of the other memory units.

SUMMARY OF THE INVENTION

It is therefore an object of the present invention to provide a memory module in which balanced parasitic capacitive loads are established with immunity to external factors such as operating characteristics and device variability.

According to a broader aspect, the present invention provides a memory module comprising first and second integrated-circuit memory units, each including a control pin terminal and a third integrated-circuit memory unit including a vacant pin terminal and a control pin terminal. A first plurality of connections are provided for receiving a control signal from an external source and supplying the received signal to the control pin terminal of the first and second memory units. A second plurality of connections receive and supply the control signal to the control pin terminal of the third memory unit and the vacant pin terminal. Preferably, the third memory unit includes a circuit equivalent in operating characteristics to a circuit connected to the control pin terminal, and the vacant pin terminal is connected to the equivalent circuit.

According to a second aspect, the present invention provides a memory module comprising a first group of integrated-circuit memory units, each including a control pin terminal, and a second group of integrated-circuit memory units each including a control pin terminal. At least one of the memory units of the second group further includes at least one vacant pin terminal. A first plurality of connections receive a control signal from an external source and supply the received signal to the control pin terminal of each of the first group of memory units. A second plurality of connections receive and supply the control signal to the control pin terminal of each of the second group of memory units and to at least one vacant pin terminal of the second group of memory units. Preferably, the vacant pin terminal is connected to a circuit equivalent in operating characteristics to a circuit connected to the control pin terminal.

According to a third aspect, the present invention provides a memory module comprising a plurality of integrated-circuit memory units, each including a vacant pin terminal and a control pin terminal, and at least two integrated-circuit memory units, each of the two memory units including a control pin terminal. A plurality of connections are provided for receiving a plurality of control signals and respectively supplying the received signals to the control pin terminal of the plurality of memory units and a second connection for receiving a control signal and supplying the received control signal to the control pin terminal of the two memory units.

BRIEF DESCRIPTION OF THE DRAWINGS

The present invention will be described in further detail with reference to the accompanying drawings, in which.

DETAILED DESCRIPTION

Figure 1:
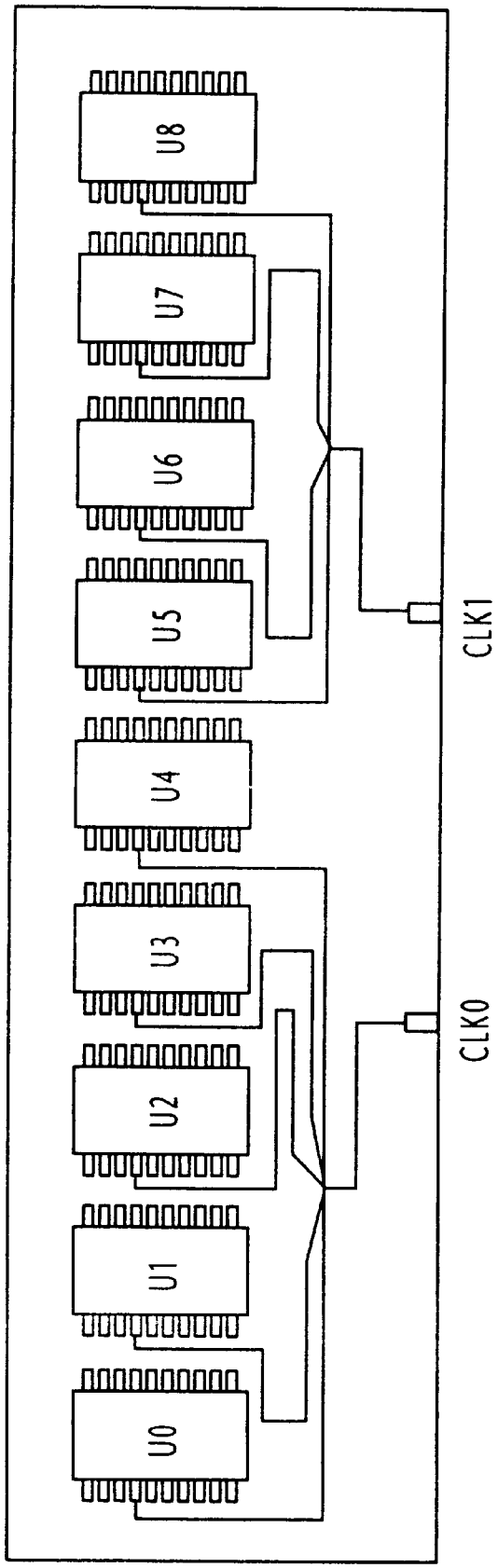
FIG. 1 is a plan view of a prior art clock-driven memory module.
Figure 2:
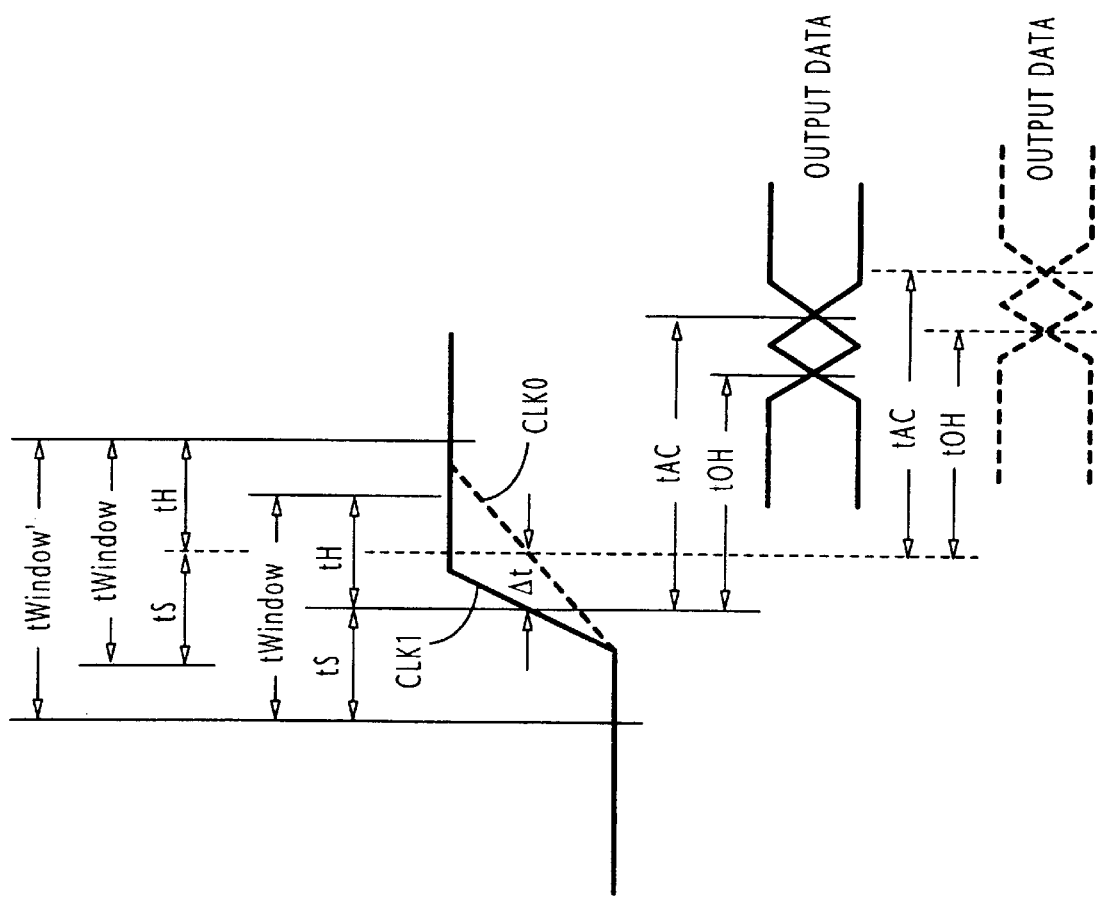
FIG. 2 is a timing diagram associated with the prior art memory module.
Figure 3:
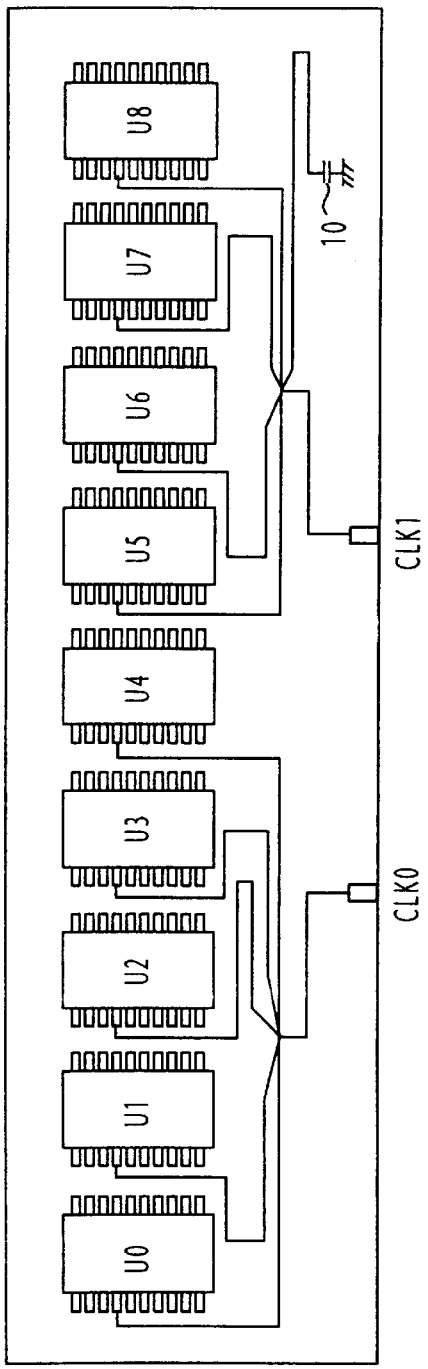
FIG. 3 is a plan view of another clock-driven prior art memory module.
Figure 4:
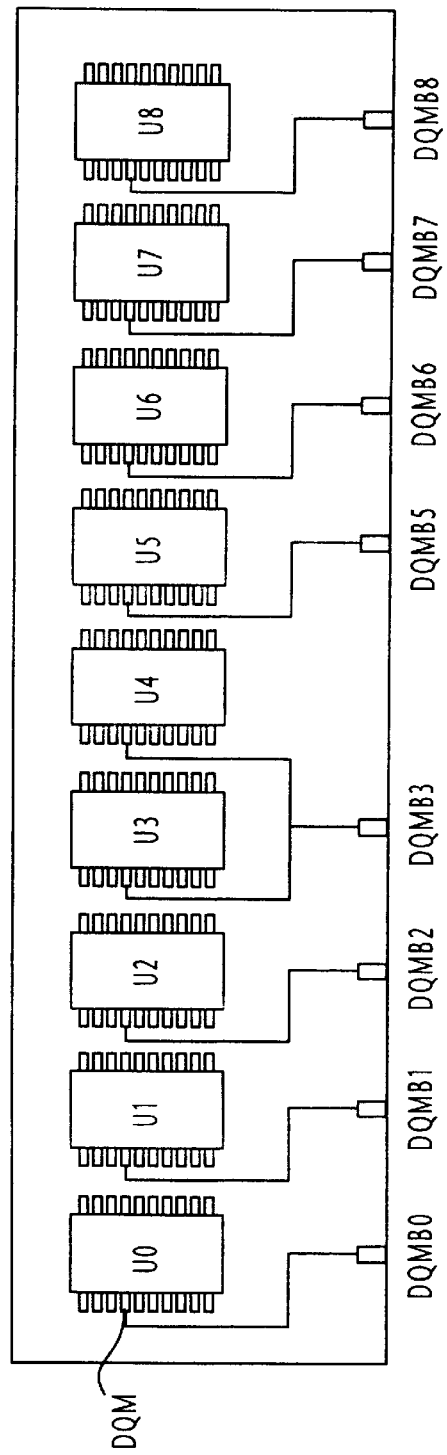
FIG. 4 is a plan view of a prior art memory module using data mask sign.
Figure 5:
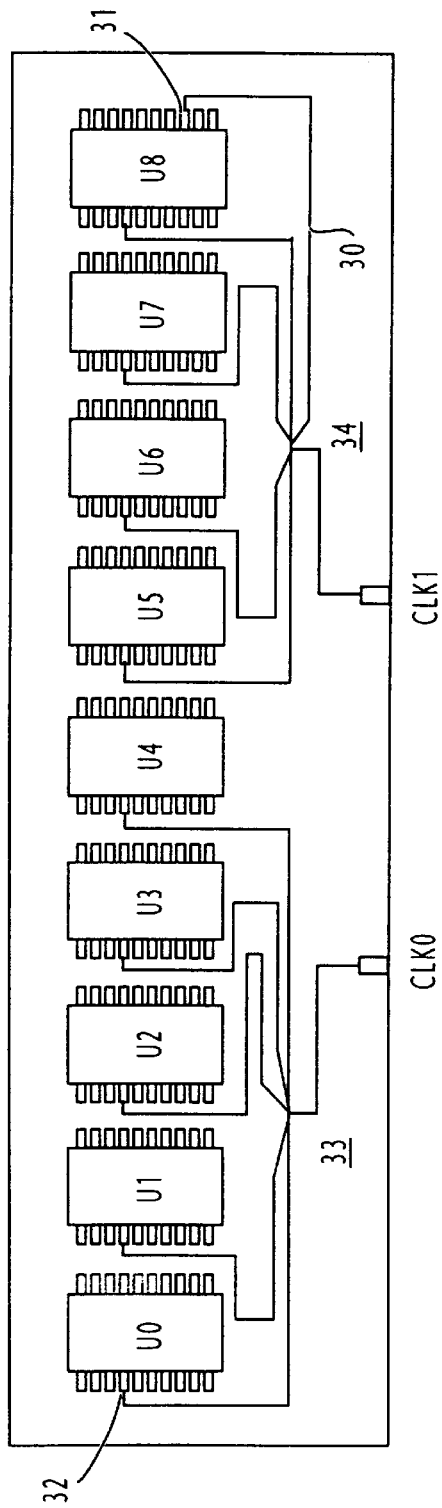
FIG. 5 is a plan view of a clock-driven memory module according to a first embodiment of the present invention.

Referring now to FIG. 5, a memory module according to one embodiment of the present invention is illustrated. The memory module includes a first group of memory units U0 to U4 connected to the clock terminal CLK0 by a plurality of connections 33 and a second group of memory units U5 to U8 connected to the clock terminal CLK1 by a plurality of connections 34. This embodiment utilizes the parasitic capacitance associated with a vacant terminal 31 of at least one memory unit, known as a non-connection pin (NCP) terminal, as a capacitive element for balancing against the parasitic capacitance associated with a clock pin terminal 32 of the memory unit.

Figure 6:
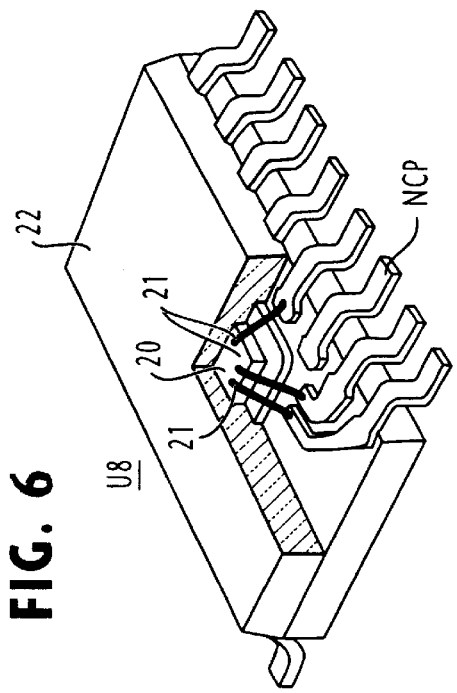
FIG. 6 is a partially broken perspective view of a memory unit, illustrating details of a vacant pin terminal.

As shown in FIG. 6, the NCP terminal of a memory unit has no connection to its internal semiconductor memory chip 20. Pin terminals other than NCP terminals are connected to the memory chip 20 by bonding wires 21. Memory chip 20 with bonding wires 21 and all pin terminals are tightly sealed in a resin mold 22, so that pin terminals partially extend into the mold. Users can identify which pin terminals are NCP terminals using catalog or specifications. Since the parasitic capacitance associated with each pin terminal depends on design, production process and operating voltage, the parasitic capacitance of the NCP terminal has substantially the same parasitic capacitance as those of other pin terminals.

Since the clock terminal CLK1 is associated with the memory unit group having one memory unit smaller than the other group, capacitive balance is established by providing a connection 30 between the clock terminal CLK1 and an NCP terminal 31 of one of memory units U5 to U8. In the illustrated embodiment, the memory unit U8 is used to compensate for the insufficient capacitive load of the memory units of clock group CLK1, as shown in FIG. 5.

Since memory units manufactured by the same process (lot) are known to possess variability of predictable distribution, capacitive loads of different clock groups of memory units are averaged out and assume the same value.

Figure 7:
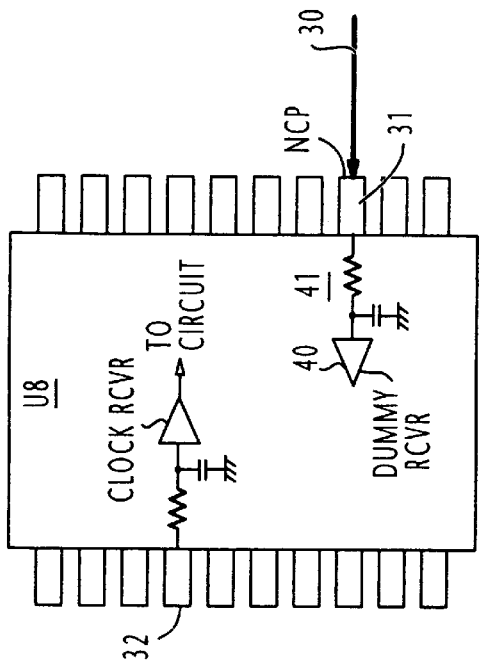
FIG. 7 is a circuit diagram of a memory unit according to a second embodiment of the present invention.

The parasitic capacitance of an NCP terminal of a memory unit can be made precisely equal to the parasitic capacitance of its clock pin terminal. In FIG. 7, the memory unit U8 is provided with a dummy receiver 40 and a resistance-capacitance network 41 which are similar in characteristics to the receiver circuitry connected to the clock pin terminal 32 of the memory unit. By connecting the NCP terminal to the dummy receiver 40 via the resistance-capacitance network 41, the NCP terminal acquires the same parasitic capacitance as that of the clock pin terminal 32. In terms of parasitic capacitance the NCP terminal of a memory unit has the same associated circuitry as the circuitry associated with the clock terminal of the memory unit. Since the associated circuitry of both terminals are mounted on the same integrated-circuit chip, the parasitic capacitive loads of the NCP and clock terminals of each memory unit are not affected by possible variability due to different lots of manufacture.

It is seen that if the number of memory units of one clock group is two or more memory units less than the other group, two or more NCP terminals are used to compensate for the capacitive imbalance.

Figure 8:
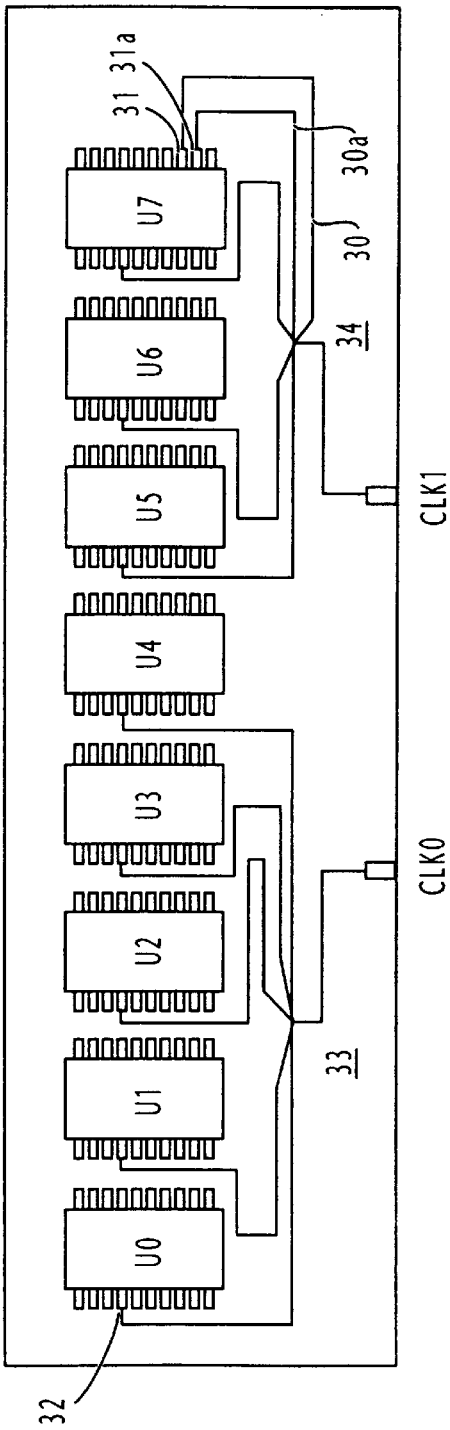
FIGS. 8 and 9 are plan views of clock-driven memory modules, in each of which the memory groups differ in number by more than one memory unit.

For example, if design considerations dictate that memory units are divided into a first group of five memory units U0 to U4 and a second group of three memory units U5 to U7 and if the memory unit U7 has two NCP terminals 31 and 31a, as shown in FIG. 8, connections 30 and 30a may be provided between clock terminal CLK1 and the NCP terminals 31 and 31a.

Figure 9:
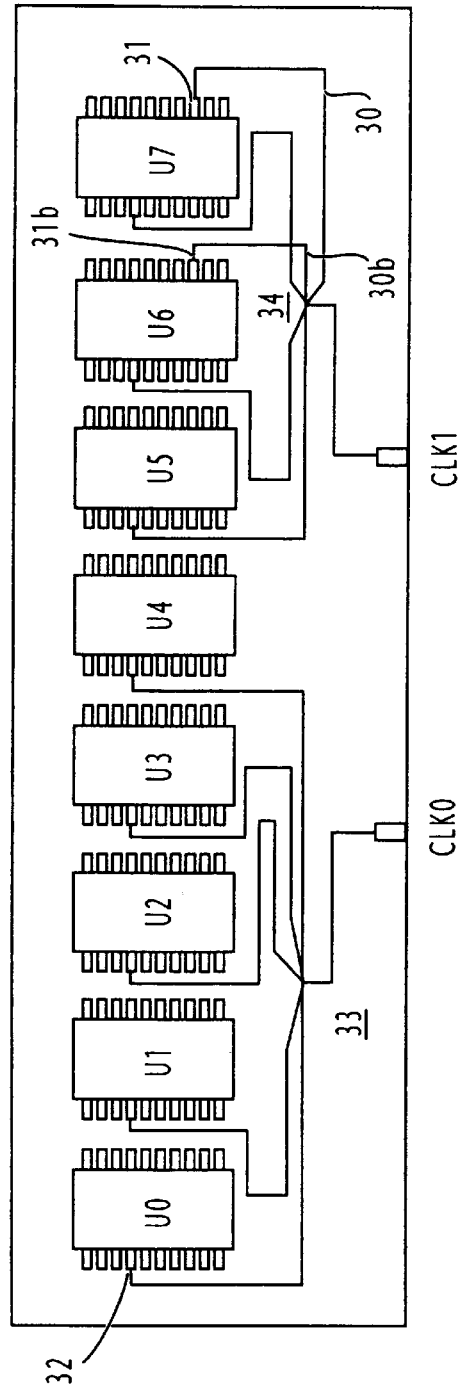

Alternatively, if the memory unit U6 has an NCP terminal 31b, as shown in FIG. 9, a connection 30b may be provided between the clock terminal CLK1 and the NCP terminal 31b, instead of using the second NCP terminal 31a of memory unit U7.

Figure 10:
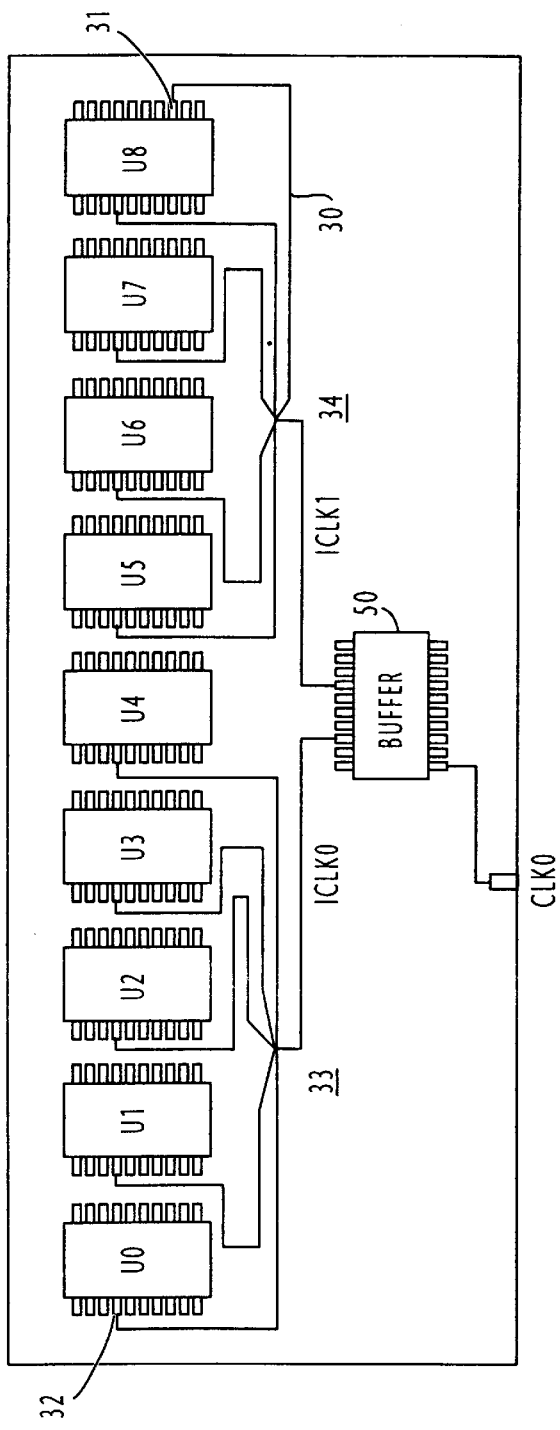
FIG. 10 is a plan view of a clock-driven memory module in which a clock buffer is additionally provided.

The present invention can be used in a memory module in which a clock buffer 50 is provided as illustrated in FIG. 10. This memory module has a single clock terminal CLK0 which is connected to an input port terminal of the buffer 50. Buffer 50 has a plurality of output ports. One output is connected by leads 33 to the clock pin terminal 32 of memory units U0 to U4 and another output port is connected by leads 34 to the clock pin terminal of memory units U5 to U8 to deliver the buffered clock pulse sequences ICLK0 and ICLK1 to the respective groups of memory units.

Figure 11:
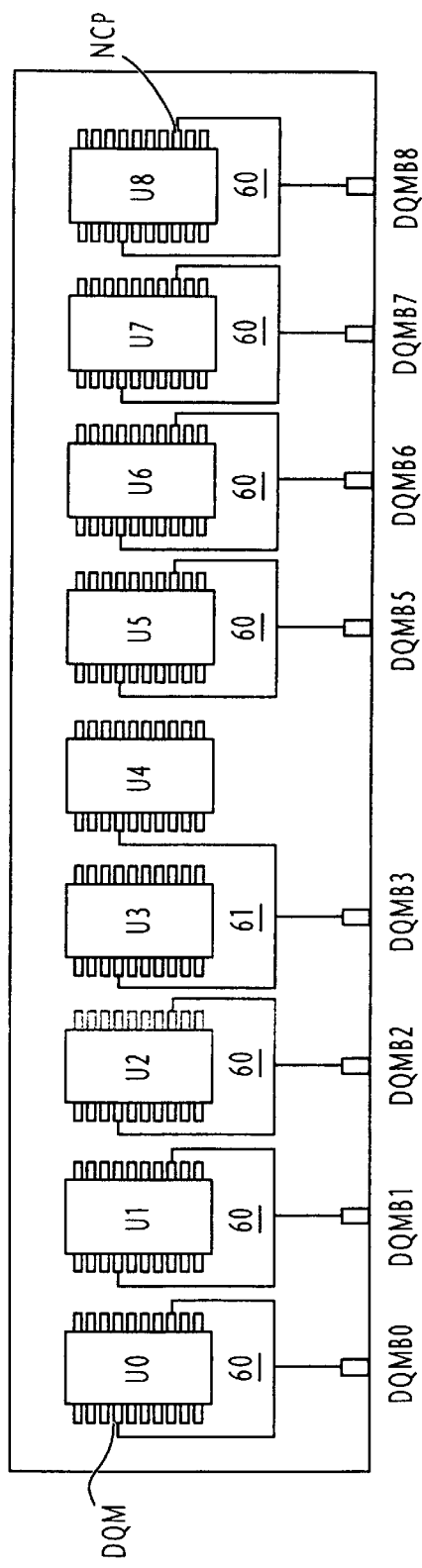
FIG. 11 is a plan view of a memory module of the present invention in which data mask signals are used as control signals.

FIG. 11 shows another embodiment of the present invention in which data mask signals DQMB are used. These signals are used for masking data values of input and output signals. Each memory unit has a DQM terminal and an NCP terminal. Except for memory units U3 and U4, each of the other memory units has its DQM and NCP terminals coupled together by a connection 60 to a corresponding DQMB terminal. Memory units U3 and U4 have their DQM terminals coupled together by a connection 61 to the DQMB1 terminal.

In this way, the capacitive load of each of the terminals DQMB0–2 and DQMB5–7 is equal to the total capacitive load of terminal DQMB3 that is associated with the memory units U3 and U4.

What is claimed is:

1. A memory module comprising:

first and second integrated-circuit memory units, each of the first and second memory units including a control pin terminal;

a third integrated-circuit memory unit including a vacant pin terminal and a control pin terminal;

a first plurality of connections for receiving a control signal from an external source and supplying the received control signal to the control pin terminal of the first and second memory units; and a second plurality of connections for receiving said control signal and supplying the received control signal to the control pin terminal of said third memory unit and said vacant pin terminal.

2. A memory module as claimed in claim 1, wherein said third memory unit includes a circuit equivalent in operating characteristics to a circuit connected to said control pin terminal, and wherein said vacant pin terminal is connected to said equivalent circuit.

3. A memory module as claimed in claim 1, further comprising a buffer having an input port for receiving said control signal from said external source and a first output port for supplying the received control signal to said first plurality of connections and a second output port for supplying the received control signal to said second plurality of connections.

4. A memory module as claimed in claim 3, wherein said control pin terminal is a clock pin terminal and said control signal is a clock pulse sequence.

5. A memory module as claimed in claim 1, wherein said control pin terminal is a clock pin terminal and said control signal is a clock pulse sequence.

6. A memory module as claimed in claim 1, wherein said control pin terminal is a data mask pin terminal and said control signal is a data mask signal.

7. A memory module comprising:
- a first group of integrated-circuit memory units, each of the memory units including a control pin terminal;
- a second group of integrated-circuit memory units, each of the memory units including a control pin terminal and at least one of the memory units further including at least one vacant pin terminal;
- a first plurality of connections for receiving a control signal from an external source and supplying the received control signal to the control pin terminal of each of said first group of memory units; and
- a second plurality of connections for receiving said control signal and supplying the received control signal to the control pin terminal of each of said second group of memory units and to at least one vacant pin terminal (31, 31a, 31b) of the second group of memory units.

8. A memory module as claimed in claim 7, wherein at least one memory unit of the second group of memory units includes a circuit equivalent in operating characteristics to a circuit connected to said control pin terminal, and wherein said vacant pin terminal is connected to said equivalent circuit.

9. A memory module as claimed in claim 7, wherein one memory unit of the second group of memory units includes more than one vacant pin terminal and said second plurality of connections include connections for supplying the received control signal to said more than one vacant pin terminal.

10. A memory module as claimed in claim 9, wherein said one memory unit of the second group of memory units includes more than one circuit equivalent in operating characteristics to a circuit connected to said control pin terminal, and wherein said more than one vacant pin terminal is connected to said more than one equivalent circuit.

11. A memory module as claimed in claim 7, wherein more than one memory unit of second plurality of memory units includes vacant pin terminals respectively and said second plurality of connections include connections for supplying the received control signal to the vacant pin terminals of said more than one memory unit.

12. A memory module as claimed in claim 11, wherein each of said more than one memory unit of the second group of memory units includes a circuit equivalent in operating characteristics to a circuit connected to said control pin terminal, and wherein each of said vacant pin terminals is connected to the equivalent circuit of said each of said more than one memory unit.

13. A memory module comprising:
- a plurality of integrated-circuit memory units, each of the memory units including a vacant pin terminal and a control pin terminal;
- at least two integrated-circuit memory units, each of the two memory units including a control pin terminal;
- a plurality of connections for receiving a plurality of control signals and respectively supplying the received control signals to said vacant pin terminal and the control pin terminal of said plurality of memory units; and
- a second connection for receiving a control signal and supplying the received control signal to the control pin terminal of said two memory units.

14. A memory module as claimed in claim 13, wherein said control pin terminal is a data mask pin terminal and each of said control signals is a data mask signal.

15. A memory module as claimed in claim 13, wherein each of said plurality of integrated-circuit memory units includes a circuit equivalent in operating characteristics to a circuit connected to said control pin terminal, and wherein said vacant pin terminal is connected to said equivalent circuit.

* * * * *